United States Patent
Schroeder et al.

(10) Patent No.: US 9,347,987 B2
(45) Date of Patent: May 24, 2016

(54) DIRECT LIQUID-CONTACT MICRO-CHANNEL HEAT TRANSFER DEVICES, METHODS OF TEMPERATURE CONTROL FOR SEMICONDUCTIVE DEVICES, AND PROCESSES OF FORMING SAME

(75) Inventors: Christopher R. Schroeder, Gilbert, AZ (US); Christopher W. Ackerman, Phoenix, AZ (US); James C. Shipley, Gilbert, AZ (US); Tolga Acikalin, Chandler, AZ (US); Ioan Sauciuc, Phoenix, AZ (US); Michael L. Rutigliano, Chandler, AZ (US); James G. Maveety, Campbell, CA (US); Ashish X. Gupta, Chandler, AZ (US)

(73) Assignee: INTEL CORPORATION, Santa Clara, CA (US)

(*) Notice: Subject to any disclaimer, the term of this patent is extended or adjusted under 35 U.S.C. 154(b) by 1087 days.

(21) Appl. No.: 12/590,379

(22) Filed: Nov. 6, 2009

(65) Prior Publication Data
US 2011/0109335 A1 May 12, 2011

(51) Int. Cl.
*H01L 23/473* (2006.01)
*G01R 31/28* (2006.01)
*F28F 3/12* (2006.01)

(52) U.S. Cl.
CPC ............ *G01R 31/2875* (2013.01); *F28F 3/12* (2013.01); *G06F 2200/201* (2013.01); *H01L 23/473* (2013.01)

(58) Field of Classification Search
CPC .......................... H01L 23/467; H01L 23/473
USPC ............. 324/750.03, 750.08, 629, 688, 689, 324/699; 361/699
See application file for complete search history.

(56) References Cited

U.S. PATENT DOCUMENTS

| | | | |
|---|---|---|---|
| 3,710,251 A | 1/1973 | Hagge et al. | |
| 5,021,924 A * | 6/1991 | Kieda | H01L 23/4336 165/104.33 |
| 5,038,852 A * | 8/1991 | Johnson | B01J 19/0046 165/267 |
| 5,285,351 A * | 2/1994 | Ikeda | H01L 23/433 165/104.33 |

(Continued)

FOREIGN PATENT DOCUMENTS

| | | |
|---|---|---|
| CN | 101080160 | 11/2007 |
| JP | 62-150828 | 7/1987 |

(Continued)

OTHER PUBLICATIONS

Office Action 1 for U.S. Appl. No. 14/476,764, dated Aug. 3, 2015, 12 pp.*

(Continued)

*Primary Examiner* — Jermele M Hollington
*Assistant Examiner* — Christopher McAndrew
(74) *Attorney, Agent, or Firm* — Konrad Raynes Davda & Victor LLP; Alan S. Raynes

(57) ABSTRACT

An apparatus to test a semiconductive device includes a base plane that holds at least one heat-transfer fluid unit cell. The at least one heat-transfer fluid unit cell includes a fluid supply structure including a supply-orifice cross section as well as a fluid return structure including a return-orifice cross section. The supply-orifice cross section is greater than the return-orifice cross section. A die interface is also included to be a liquid-impermeable material.

20 Claims, 10 Drawing Sheets

(56) References Cited

U.S. PATENT DOCUMENTS

| | | | |
|---|---|---|---|
| 5,477,611 A * | 12/1995 | Sweis | G06K 19/07745 174/533 |
| 5,684,669 A | 11/1997 | Collins et al. | |
| 5,754,391 A | 5/1998 | Bates | |
| 6,248,222 B1 | 6/2001 | Wang | |
| 6,391,166 B1 | 5/2002 | Wang | |
| 6,448,575 B1 | 9/2002 | Slocum et al. | |
| 6,488,040 B1 | 12/2002 | de Larios et al. | |
| 6,550,990 B2 | 4/2003 | Sakurai et al. | |
| 6,741,090 B2 * | 5/2004 | Yamashita | G01R 1/0408 324/750.08 |
| 6,887,803 B2 | 5/2005 | Yoo | |
| 6,988,327 B2 | 1/2006 | Garcia et al. | |
| 7,017,654 B2 * | 3/2006 | Kenny | F28F 3/086 165/104.33 |
| 7,412,983 B2 | 8/2008 | Mori | |
| 7,595,468 B2 | 9/2009 | Moon et al. | |
| 7,739,876 B2 | 6/2010 | Gupta et al. | |
| 7,742,299 B2 | 6/2010 | Sauciuc et al. | |
| 7,819,179 B2 * | 10/2010 | Hayashi | F25B 41/04 165/260 |
| 7,888,951 B2 | 2/2011 | Lupashku et al. | |
| 7,982,478 B2 | 7/2011 | Abazarnia et al. | |
| 8,177,993 B2 | 5/2012 | Seah et al. | |
| 8,410,802 B2 | 4/2013 | Gupta et al. | |
| 2002/0075624 A1 * | 6/2002 | Wang | C04B 37/006 361/234 |
| 2003/0102861 A1 * | 6/2003 | Kushihara | H02P 6/16 324/207.15 |
| 2003/0217558 A1 | 11/2003 | Wall et al. | |
| 2004/0182560 A1 | 9/2004 | Kenny et al. | |
| 2005/0111188 A1 | 5/2005 | Bhattacharya et al. | |
| 2006/0114013 A1 | 6/2006 | Kabbani | |
| 2007/0119565 A1 | 5/2007 | Brunschwiler et al. | |
| 2007/0274045 A1 * | 11/2007 | Campbell | F28C 3/08 361/699 |
| 2008/0002365 A1 | 1/2008 | Gupta | |
| 2008/0149147 A1 | 6/2008 | Wilcoxson et al. | |
| 2008/0237843 A1 | 10/2008 | Gupta et al. | |
| 2009/0130858 A1 | 5/2009 | Levy | |
| 2009/0308413 A1 | 12/2009 | Freer et al. | |
| 2011/0048467 A1 | 3/2011 | Lin et al. | |
| 2011/0155348 A1 | 6/2011 | Gupta et al. | |
| 2013/0000679 A1 | 1/2013 | Parra-Garcia et al. | |
| 2015/0285857 A1 | 10/2015 | Schroeder et al. | |

FOREIGN PATENT DOCUMENTS

| | | |
|---|---|---|
| JP | 08-037260 | 2/1996 |
| JP | 11-224127 | 8/1999 |
| JP | 2002-343711 | 11/2002 |
| JP | 2001-068499 | 2/2013 |

OTHER PUBLICATIONS

Response to Office Action 1 for U.S. Appl. No. 14/476,764, dated Nov. 3, 2015, 8 pp.*
Office Action 1 and Search Report for TW Application No. 99132165, dated Oct. 16, 2015, 9 pp. (W/ English Language Translation of Search Report).*
Office Action 1 for KR Application No. 10-2010-92950, Jan. 20, 2012, and English translation, 5 pp.
Final Office Action 1 for U.S. Appl. No. 12/647,261, dated Aug. 10, 2012, 8 pp.
Notice of Allowance for U.S. Appl. No. 12/647,261, dated Nov. 30, 2012, 6 pp.
Office Action 1 for U.S. Appl. No. 12/647,261, dated Aug. 10, 2012, 8 pp.
Office Action 1 for U.S. Appl. No. 13/175,679, dated Sep. 14, 2012, 10 pp.
Office Action 2 for KR Application No. 10-2010-92950, dated Oct. 29, 2012, 2 pp.
Response to Final Office Action 1 for U.S. Appl. No. 12/647,261, dated Nov. 13, 2012, 7 pp.
Response to Office Action 1 for KR Application No. 10-2010-92950, dated Jun. 20, 2012, 21 pp.
Response to Office Action 1 for U.S. Appl. No. 12/647,261, dated Jul. 9, 2012, 9 pp.
Response to Office Action 1 for U.S. Appl. No. 13/175,679, dated Dec. 14, 2012, 8 pp.
Machine Translation for JP Publication No. 11-224127, dated Aug. 17, 1999, 25 pp.
Final Office Action for U.S. Appl. No. 13/175,679, dated Feb. 5, 2013, 13 pp.
Pre-Appeal Brief Request for Review for U.S. Appl. No. 13/175,679, dated Jul. 5, 2013, 6 pp.
International Search Report and Written Opinion for International Application No. PCT/US2012/045118, dated Jan. 10, 2013, 17 pp.
Office Action 1 for CN Application No. CN201010575938.8, dated Nov. 22, 2012, 20 pp.
Office Action 2 for CN Application No. CN201010575938.8, dated Jun. 21, 2013, 13 pp.
Response to Office Action 2 for KR Application No. KR10-2010-92950 (with Translation of Pending Claims), dated Jan. 29, 2013, 19 pp.
Office Action 3 for CN Application No. 201010575938.8, dated Mar. 4, 2014, 9 pp. (w/ English Translation).
Response to Office Action 2 for CN Application No. 201010575938.8, dated Nov. 6, 2013, 16 pp. (w/ English Translation of Amended Claims).
Response to Office Action 3 for CN Application No. 201010575938.8, dated May 19, 2014, 16 pp. (w/ English Translation of Amended Claims).
Office Action 4 for CN Application No. 201010575938.8, Jul. 24, 2014, 16 pp. [W/ English Language Translation].
Office Action 6 for CN Application No. 201010575938.8, Apr. 27, 2015, 5 pp.
Office Action 5 for CN Application No. CN201010575938.8, dated Dec. 17, 2014, 13 pp. [W/ English Language Translation].
Response to Office Action 5 for CN Application No. 201010575938.8, dated Mar. 2, 2015, 16 pp. (w/ English Translation of Amended Claims).
Response to Office Action 4 for CN Application No. 201010575938.8, dated Oct. 8, 2014, 16 pp. (w/ English Translation of Amended Claims).
English Translation of Office Action 6 for CN Application No. 201010575938.8, Apr. 27, 2015, 5 pp. translation, 5 pp. CN Office Action.

* cited by examiner

DIRECT LIQUID-CONTACT MICRO-CHANNEL HEAT TRANSFER DEVICES, METHODS OF TEMPERATURE CONTROL FOR SEMICONDUCTIVE DEVICES, AND PROCESSES OF FORMING SAME

TECHNICAL FIELD

Microelectronic devices are put under severe workloads during use that may affect performance. Challenges involved with such devices include test performance as miniaturization continues to track Moore's Law.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

Figure 1:
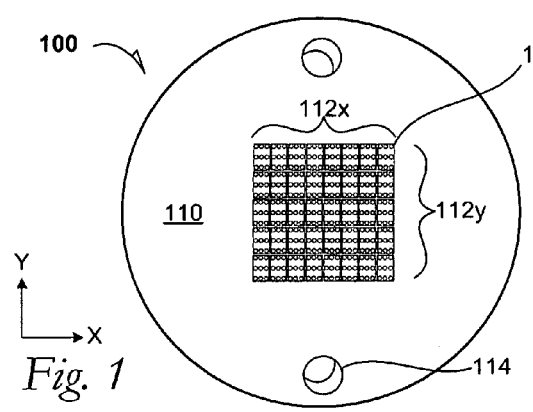
FIG. 1 is a bottom plan of a direct fluid-contact thermal block for a semiconductive device cooling apparatus according to an embodiment.

FIG. 1 is a bottom plan of a direct fluid-contact thermal block 100 for a semiconductive device cooling apparatus according to an embodiment. A die interface surface 110 exhibits a fluid-flow array 112 with a plurality of unit cells, one of which is indicated with the reference numeral 1. The fluid-flow array 112 may also be referred to as a device-under-test (DUT) footprint 112 and is configured to approximately match a device such as a processor die.

In the illustrated embodiment, the fluid-flow array 112 includes 120 unit cells defined by a 24 unit-cell dimension 112x along an X-axis and a five unit-cell dimension 112y along a Y-axis. The die interface surface 110 is part of a base plane of a plurality of stacked composites that form the direct fluid-contact thermal block 100 according to an embodiment. A plurality of head bolt orifices are provided, one of which is indicated with reference numeral 114.

Figure 2:
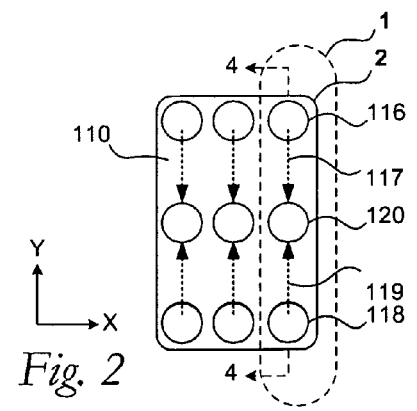
FIG. 2 is a detail section of the indicated unit cell taken from the fluid-flow array depicted in FIG. 1 according to an example embodiment.

FIG. 2 is a detail section of the indicated unit cell 1 taken from the fluid-flow array 112 depicted in FIG. 1 according to an example embodiment. The unit cell 1 is grouped with two other unit cells within a unit block 2 embodiment. The unit block 2 embodiment encompasses the die interface surface 110 and in this embodiment includes nine orifices for fluid flow. As seen in FIG. 1, the unit cells are grouped in threes within the unit block 2 embodiment (FIG. 2), and the unit block 2 embodiments are grouped as an eight-by-five unit block array of micro-scale channels.

The unit block 2 embodiment includes a fluid-supply structure with six orifices and a fluid-return structure with three orifices. The unit cell 1 is configured such that there is a larger cross sectional area for the total of fluid-supply-orifice(s) than for the total of fluid-return-orifice(s). As illustrated, the comparative larger fluid-supply-orifice cross section (hereinafter fluid-supply orifice) is embodied by a fluid-supply first orifice 116 and a fluid-supply subsequent orifice 118, and it is compared to a single fluid-return orifice 120. Fluid flow direction is illustrated with arrows 117 and 119.

Figure 3:
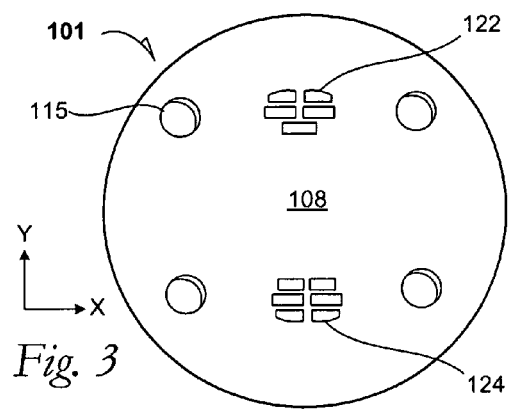
FIG. 3 is a top plan of the direct fluid-contact thermal block depicted in FIG. 1 according to an embodiment.

FIG. 3 is a top plan of the direct fluid-contact thermal block 101 depicted in FIG. 1 according to an embodiment. The direct fluid-contact thermal block 101 shows a top plane 108 that is depicted as the top surface of the thermal block 101. Supply-fluid inlets 122 and return-fluid outlets 124 are also depicted. The supply- and return-fluid inlets and outlets 122 and 124, respectively, are coupled through distribution channels to unit cells that are located on the bottom at the die interface surface 110 (FIG. 1).

A plurality of head bolt orifices are provided, one of which is enumerated with reference 115. As described below, supply and return channels are provided between the die interface surface 110 (or base plane 110) and the top plane 108.

Figure 4:
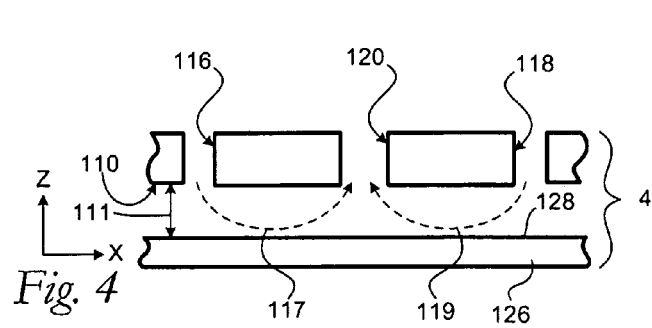
FIG. 4 is a cross-section detail that includes the unit cell depicted in FIG. 2 and taken along the section line 4-4 according to an embodiment.

FIG. 4 is a cross-section detail 4 that includes the unit cell 1 depicted in FIG. 2 and taken along the section line 4-4 according to an embodiment. A testing system 103 is depicted including the base plane 110 and a die 126 to be cooled or otherwise heat-controlled as a device-under-test (DUT 126). The DUT 126 includes an active surface 127 and a backside surface 128. In an embodiment, the DUT 126 is a flip chip.

The base plane 110 is presented facing the die 126. In an embodiment, spacing 111 between the backside 128 of the die 126 and the base plane is in a range from 20 micrometer (μm) to 2 millimeter (mm). In an embodiment, spacing 111 is 75 μm. Other spacing lengths may be used depending upon a specific application. In an embodiment where the fluid-flow array 112 (FIG. 1) is about 1 centimeter (cm) squared, spacing 111 is about 1 mm. In other embodiments, spacing is a range from 0.1 mm to 2 mm depending upon die size and an achieved heat-transfer flow regime that may be turbulent.

In an embodiment, the backside surface 128 is a bare die backside surface. In an embodiment, the die 126 has a metallization layer that constitutes the backside surface 128. In either embodiment, the backside surface 128 may be referred to as "bare die" with respect to temperature-control fluid making direct-fluid contact at the backside surface 128.

In the unit cell 1, fluid flow 117 is directed out of the fluid-supply first orifice 116 against the backside 128 of the die 126 for direct-fluid contact, followed by the fluid flow 117 of necessity exiting the single fluid-return orifice 120. It can be seen that fluid flow 119 is also directed out of the fluid-supply subsequent orifice 118, against the backside 128 of the die 126 for direct-fluid contact, followed by the fluid flow 119 of necessity also exiting the single fluid-return orifice 120. As a consequence of the configuration of the unit cell 1 (FIG. 2), the fluid-supply-orifice cross-section area is larger than the fluid-return-orifice cross section area.

In an embodiment, directing the fluid flow 117 and 119 is done onto the backside of the die and the fluid is a mixture of a liquid and a gas. In an embodiment, the fluid flow 117 and 119 is an expandable fluid such as a refrigerant such that two-phase flow is carried out. For example, the fluid flow 117 and 119 are liquid-phase flow, but at least a portion of the fluid flow 117 and 119 as they enter the fluid-return orifice 120 are vapor or gas-phase flow. Accordingly, latent heat of vaporization is transferred from the backside 128 of the die into the liquid-phase to cause the vapor- or gas phase to appear. Consequently, laminar liquid fluid flow is disrupted and driven toward turbulent flow by flashing of the coolant. Similarly, already turbulent liquid fluid flow is disrupted and driven toward more turbulent flow by flashing of the coolant.

Other embodiments may include the configuration where the fluid-supply-orifice cross-section area is larger than the fluid-return-orifice cross section area. In an example embodiment, the fluid-supply-orifice cross-section area is larger than the fluid-return-orifice cross section area by virtue of equal cross-section area orifices, but there are provided more supply orifices than return orifices. This may be seen in the specific embodiment depicted in FIGS. 2 and 4. In an embodiment, the fluid-supply-orifice cross-section area is larger than the fluid-return-orifice cross section by virtue of larger supply orifices than return orifices. Other embodiments may be carried out to accomplish the fluid-supply-orifice cross-section area to be larger than the fluid-return-orifice cross section area.

In an embodiment, flow is a bilateral perimeter-supply flow regime as illustrated in FIGS. 2 and 4. The flow is an influx regime at two perimeters of the unit cell 1 and an exit-flow regime at the center of the unit cell 1. It can now be observed that flow within a unit cell is primarily constrained by at least one adjacent fluid-flow unit cell. For example, even where the unit block 2 is a corner block in the fluid-flow array 112, and the unit cell 1 is at the corner, because it is adjacent three unit cells, flow is primarily constrained by at least one adjacent fluid-flow unit cell. The unit cell to the left of unit cell 1 is constrained by 5 adjacent unit cells where the unit block 2 is along an edge of the fluid-flow array 112. And the unit cell to the left of unit cell 1 is constrained by 8 adjacent unit cells where the unit block 2 is anywhere away from an edge of the fluid-flow array 112.

It can be seen that the DUT 126 is not touched by any equipment of the direct fluid-contact thermal block. Consequently, the application of direct fluid microchannel cooling to DUTs is a useful method for minimizing test-transient temperature responses because the heat transfer fluid makes direct contact with the device while the heat transfer fluid is forced into a micro scale flow regime that may be turbulent or streamlined (also referred to as laminar). The test equipment itself does not make physical contact with the surface of the DUT into which or from which heat will be transferred. As a consequence of no physical contact during testing, manufacturing yield loss is reduced. Such yield loss may arise from cosmetic product damage when mechanical contact is made in a conventional manner, although physical damage may also be a source of manufacturing yield loss.

It can be seen from FIG. 4 that converging short loop channel flow without separation walls at the base plane 110 reduces stagnation zones on the backside surface 128 of the die 126 to improve heat transfer. This converging short loop channel flow without separation walls may result in greater temperature uniformity while improving manufacturability.

Figure 5:
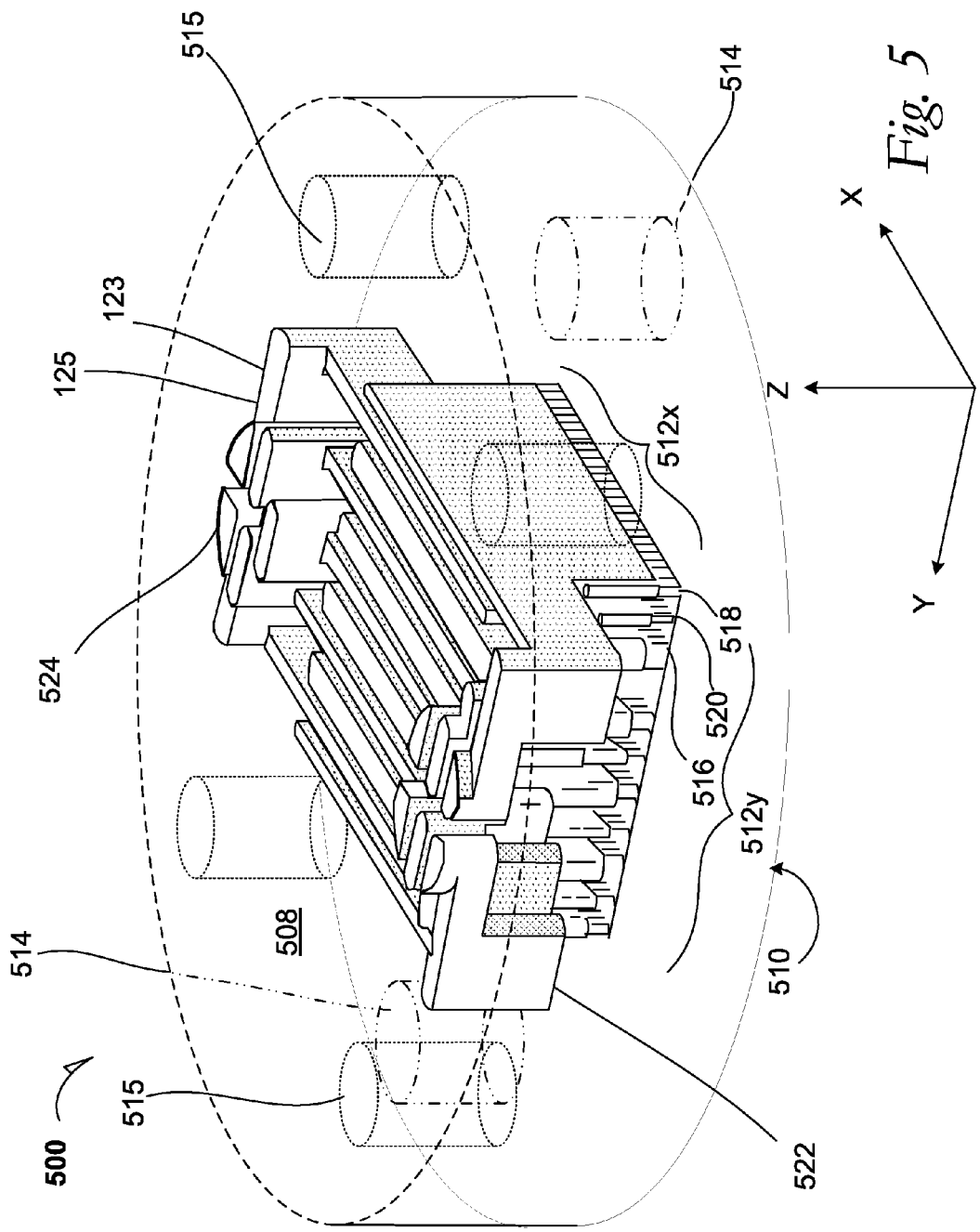
FIG. 5 is a partially transparent perspective elevation of a direct fluid-contact thermal block according to an example embodiment.
Figure 6:
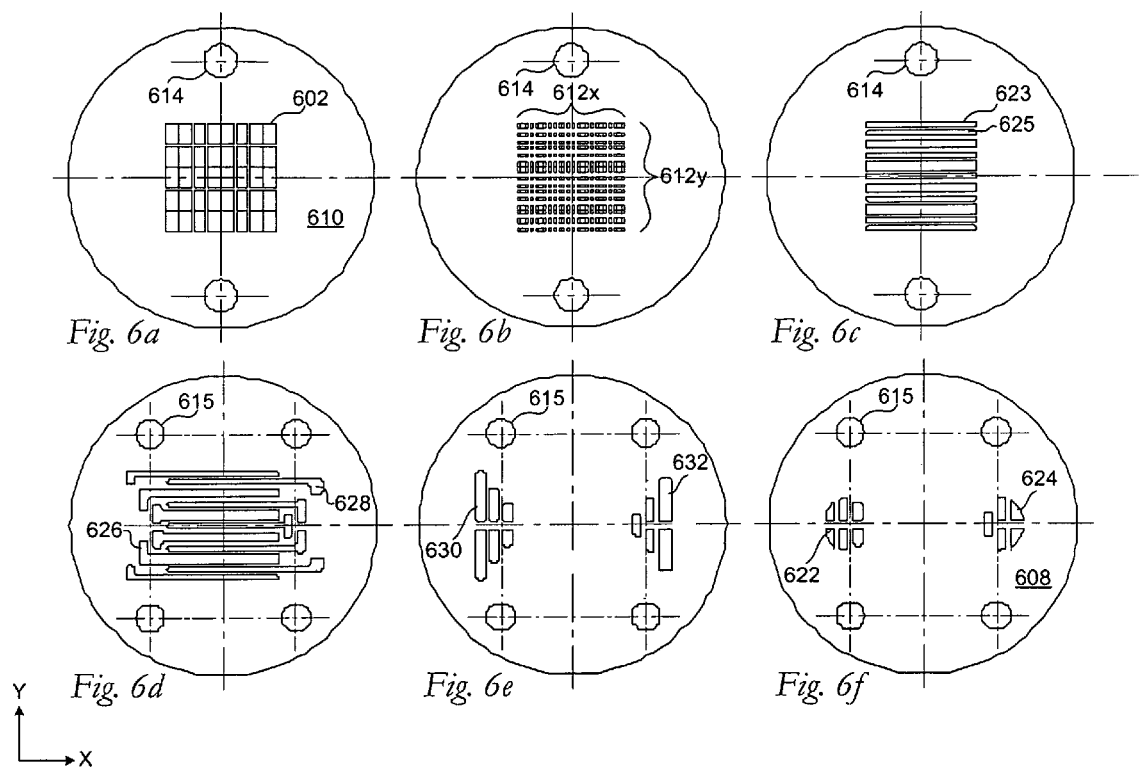
FIGS. 6a through 6f illustrate several laminate layer types that make up a direct fluid-contact thermal block embodiment.

FIG. 5 is a partially transparent perspective elevation of a direct fluid-contact thermal block 500 according to an example embodiment. A top surface 508 and a base plane 510 represent the bounds in the Z-dimension for the direct fluid-contact thermal block 500. Head bolt orifices 514 are represented to communicate through the base plane 510 but not to breach the top surface 508. Four head bolt orifices 515 (two referenced) are represented to communicate through the top surface 508, but not to breach the base plane 510.

A unit cell is indicated with a fluid-supply first orifice 516 and a fluid-supply subsequent orifice 518, along with a single fluid-return orifice 520. Fluid flow direction is therefore a bilateral perimeter flow from the fluid-supply orifices 516 and 518 to the center at the fluid-return orifice 520 without the use of separation walls or baffles. The several unit cells are arranged in a fluid-flow array 512 that is defined by a dimension 512$x$ along an X-axis and a unit-cell dimension 512$y$ along a Y-axis.

Fluid supply to the direct fluid-contact thermal block 500 is facilitated with supply-fluid inlets 522. As illustrated, six supply-fluid inlets 522 are provided. Fluid return from the direct fluid-contact thermal block 500 is facilitated with five return-fluid outlets 524. The supply- and return-fluid inlets and outlets 522 and 524, respectively are coupled through distribution channels to unit cells that are located on the bottom at the die interface surface 510.

Fluid distribution to and from the several unit cells is achieved with fluid-supply distributors, one of which is indicated with reference numeral 523, and fluid-return collectors, one of which is indicated with reference numeral 525.

FIGS. 6a through 6f illustrate several laminate layer types that make up a direct fluid-contact thermal block embodiment.

In FIG. 6a, first laminate type includes a die interface surface 610. The first laminate type 6a exhibits a fluid-flow array with a plurality of unit cells that are further grouped as unit blocks, one of which is illustrated with reference numeral 602. Three unit cells multiplied by 40 unit blocks amounts to a total of 120 unit cells for a microchannel array in the illustrated embodiment.

In an embodiment, the first laminate type 6a is 5 mils (thousandths of an inch, also 127 μm) thick and is a single layer. The die interface surface 610 is part of a base plane of a plurality of stacked composites that form a direct fluid-contact thermal block according to an embodiment. A plurality of head bolt orifices are provided, one of which is indicated with reference numeral 614.

In FIG. 6b, a second laminate type includes a fluid-flow array 612 of 120 unit cells defined by a 24 unit-cell dimension 612x along an X-axis and a five unit-cell dimension 612y along a Y-axis. The unit cells are made of supply orifices and a smaller number of return orifices according to an embodiment. In any event, the total cross-sectional area of the supply orifices is larger than the total cross-sectional area of the return orifices. The second laminate type 6b is 5 mils thick (127 μm) and includes a total of 4 layers according to this embodiment.

In FIG. 6c, a third laminate type includes fluid-supply distributors, one of which is indicated with reference numeral 623, and fluid-return collectors, one of which is indicated with reference numeral 625. The third laminate type 6c is 10 mils (254 μm) thick and includes a total of nine layers according to this embodiment. A plurality of head bolt orifices are provided, one of which is indicated with reference numeral 614.

In FIG. 6d, a fourth laminate type includes fluid supply- and return routers 626 and 628, respectively, that couple to the respective fluid supply- and return distributors and collectors 623 and 625. The fourth laminate type 6d is 10 mils (254 μm) thick and includes a total of nine layers according to this embodiment.

In FIG. 6e, a fifth laminate type includes fluid supply- and return plenums 630 and 632, respectively, that couple to the respective fluid supply- and return routers 626 and 628. The fifth laminate type 6e is 10 mils (254 μm) thick and includes a total of five layers in this embodiment.

In FIG. 6f, a sixth laminate type includes a top plane 608 and is the top surface of this direct fluid-contact thermal block embodiment. Supply-fluid inlets 622 and return-fluid outlets 624 are also depicted. The supply- and return-fluid inlets and outlets 622 and 624, respectively, are coupled to the respective fluid supply- and return plenums 630 and 632. Consequently, the supply- and return-fluid inlets 622 and outlets 624 are coupled through the several distribution channels to unit cells that are located on the bottom at the die interface surface 610. In this embodiment, the sixth laminate type 6f is 10 mils (254 μm) thick and includes a total of two layers.

The several laminate types may be made of various materials. In an embodiment, the several laminate types are made of stainless steel. In an embodiment, the several laminate types are made of ceramics. In an embodiment, the several laminate types are made of plastics. Where the coefficient of thermal conductivity is lower than ordinary steel, temperature stability in the heat-transfer fluid is facilitated. In an embodiment, the materials of the several laminate types is made of a material that has a coefficient of thermal conductivity that is less than that of stainless steel.

Fabrication of the direct fluid-contact thermal block can be done by 3-dimensional design techniques such as using computational-flow dynamics software. The etch and bonding qualities of the selected materials may also be taken into consideration during fabrication. In an embodiment, green ceramic laminate types are partially cured, assembled as a complete block, and then fully cured such as by firing. In an embodiment, direct laser melting is used to build up the several laminate types. In an embodiment, thermoplastic laminates are assembled and glued under heated bonding techniques. Other techniques may be used according to a selected application.

Figure 7:
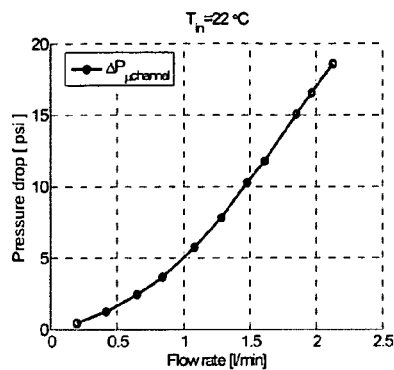
FIG. 7 is a graph that illustrates flow rate versus pumping pressure for a direct fluid-contact thermal block according to an example embodiment.

FIG. 7 is a graph of flow rate versus pumping pressure for a direct fluid-contact thermal block according to an example embodiment. The example embodiment is used on a 1 cm-by-1 cm die under test with a volumetric flow range between 0.5 liters to 2 liters per minute.

Figure 8:
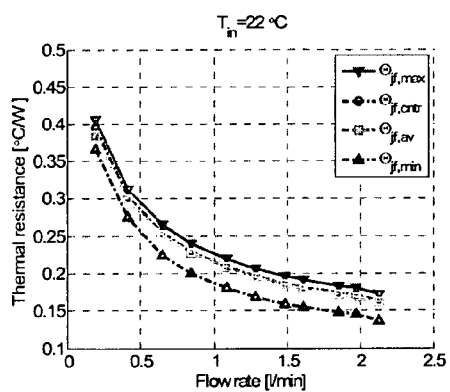
FIG. 8 is a graph of thermal performance in the flow range described in FIG. 7 according to several embodiments.

FIG. 8 is a graph of thermal performance in the flow range described in FIG. 7. The thermal performance data indicated is for water as the cooling fluid. Flow rates from maximum to minimum were used to obtain the data.

Figure 9:
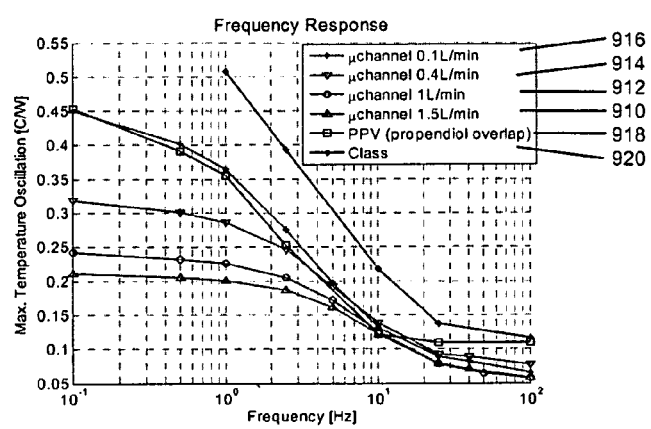
FIG. 9 is a graph of dynamic thermal response compared to a baseline according to several embodiments.

FIG. 9 is a graph of dynamic thermal response compared to a baseline. The bottom thermal response line 910 was obtained with water at 1.5 L/min. The adjacent thermal response line 912 was obtained with water at 1 L/min. The following adjacent thermal response line 914 was obtained with water at 0.4 L/min. The following adjacent thermal response line 916 was obtained with water at 0.1 L/min. The following adjacent thermal response line 918 was obtained with propendiol. And the following adjacent thermal response line 920 was obtained using conventional techniques. In an embodiment, cooling response was improved by a factor of 2- to 5 times faster than over a conventional solution. As a consequence, the thermal analog to the resistance-capacitance (RC) response was improved between 200% and 500%.

Figure 10A:
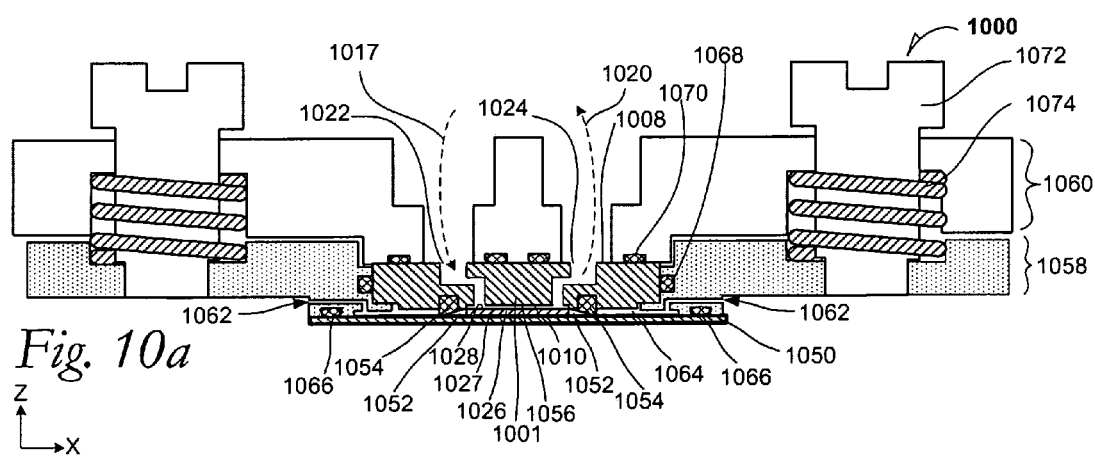
FIG. 10a is a cross-section elevation of a chip-testing system according to an example embodiment.

FIG. 10a is a cross-section elevation of a chip-testing system 1000 according to an example embodiment. A device under test 1026 (hereinafter DUT 1026) is depicted with an active surface 1027 and a backside surface 1028. The DUT 1026 may also be referred to as a die or as a semiconductive device. In an embodiment, the DUT 1026 is a processor such as an i3®, i5®, or i7® series processor made by Intel Corporation of Santa Clara, Calif. In an embodiment, the DUT 1026 is a system on a chip (SOC) such as a SOC made by Intel. In an embodiment, the DUT 1026 is a memory chip such as a NAND memory chip made by Intel. Other chips may be used as the DUT 1026.

In an embodiment, the DUT 1026 is affixed to a mounting substrate 1050 with encapsulation material 1052 that leaves the backside surface 1028 exposed as bare die. The encapsulation material 1052 is contacted by an inner seal 1054 that is part of a direct fluid-contact thermal block 1001 with a die interface surface 1010. The direct fluid-contact thermal block 1001 is depicted in simplified form compared to the direct fluid-contact thermal block 101 illustrated in FIGS. 1, 3, 5, and 6.

An inner cavity 1056 is shown between the backside surface 1028 of the DUT 1026 and the die interface surface 1010. The inner cavity 1056 can be de-pressurized to prevent unwanted cooling fluid from exiting and fouling the structures peripheral to the DUT 1026.

The direct fluid-contact thermal block 1001 is held in place with a package sealing block 1058 and a thermal fluid porting block 1060. The package sealing block 1058 is configured to receive a pressurized fluid 1062 into a pressurized outer cavity 1064. A pressure differential between the inner cavity 1056 and the pressurized outer cavity 1064 prevents unwanted cooling fluid from contacting other parts of the DUT 1026.

The pressurized outer cavity 1064 is sealed to the package sealing block 1058 with a plurality of gaskets such as sealing block O-rings 1066 and 1068. The direct fluid-contact thermal block 1001 is sealed to the thermal fluid porting block 1060 with a plurality of gaskets such as thermal block O-rings 1070.

Temperature control fluid-flow direction is illustrated with the arrow 1017 to a generically depicted supply-fluid inlet 1022 and returning fluid-flow direction is illustrated with the arrow 1020 exiting a generically depicted return-fluid outlet 1024.

The direct fluid-contact thermal block 1001 is depicted under a pressure seal 1070 from the thermal fluid porting block 1060. Spring-loaded shoulder bolts 1072 guide the thermal fluid porting block 1060 onto the direct fluid-contact thermal block 1001 and springs 1074 allow for recoil after pressure is applied.

Figure 10B:
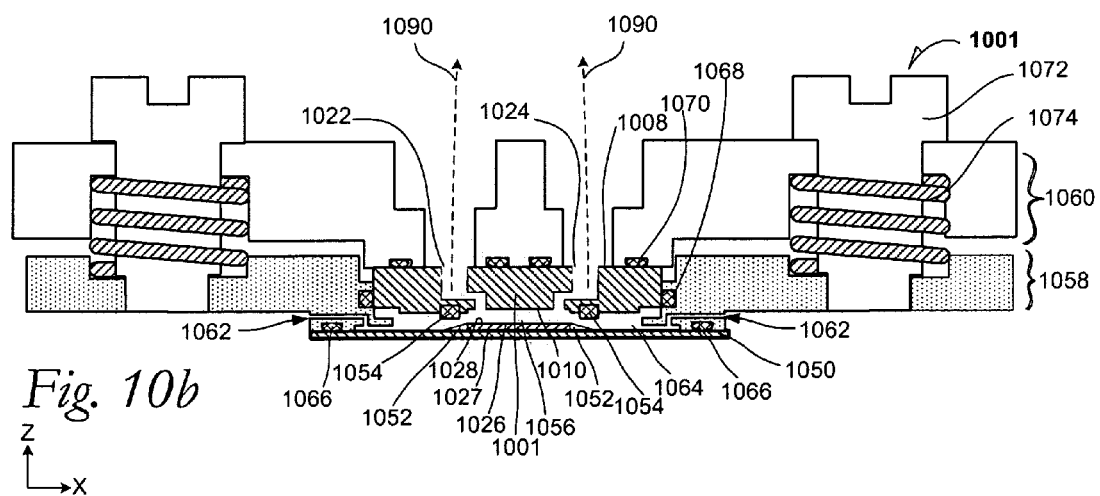
FIG. 10b is a cross-section elevation of the chip-testing system depicted in FIG. 10a after further processing according to an embodiment.

FIG. 10b is a cross-section elevation of the chip-testing system depicted in FIG. 10a after further processing according to an embodiment. The thermal fluid porting block 1060 has retracted by recoil of the springs 1074 such that the thermal fluid porting block 1060 has abutted the shoulder bolts 1072. The inner cavity 1056 is shown to be larger between the backside surface 1028 of the DUT 1026 and the die interface surface 1010 than the illustration in FIG. 10a.

It can also be seen that the direct fluid-contact thermal block 1001 has retracted along with the thermal fluid porting block 1060. During the illustrated action, a negative pressure can be imposed within the inner cavity 1056. In this method embodiment, the DUT 1026 can be moved and transported by suction after testing. The directional arrows 1090 illustrate air flow direction during pulling a low-pressure environment within the inner and outer cavities 1056 and 1064, respectively.

Figure 11:
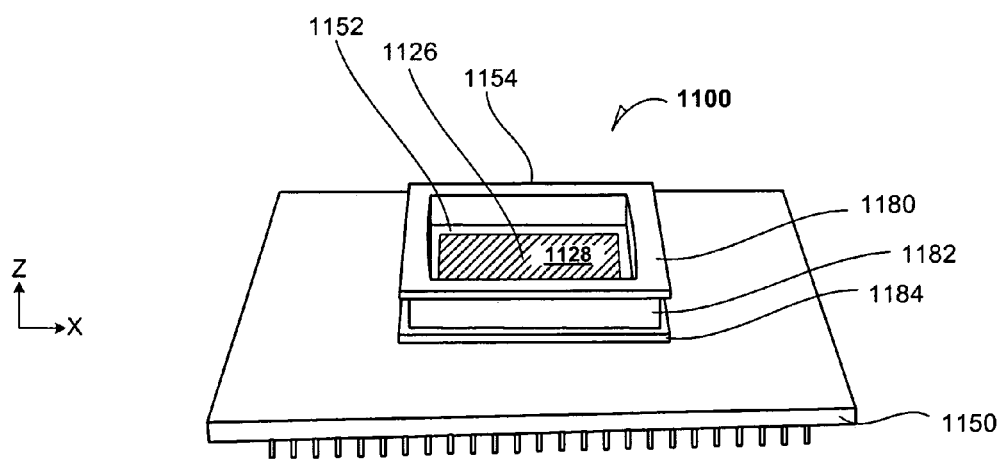
FIG. 11 is a perspective elevation of a portion of a chip-testing system 1100 according to an example embodiment.

FIG. 11 is a perspective elevation of a portion of a chip-testing system 1100 according to an example embodiment. A device under test 1126 is depicted with a backside surface 1128 exposed. The DUT 1126 is affixed to a mounting substrate 1150 with encapsulation material 1152 that leaves the backside surface 1128 exposed as bare die.

The encapsulation material 1152 is contacted by an inner seal 1154. The inner seal 1154 may be referred to as a die interface 1152. The die interface 1152 is a liquid-impermeable material that both seals the die backside surface and prevents liquid from escaping. The inner seal 1154 includes a block flange 1180, a collapsible wall 1182, and a device flange 1184 according to an embodiment. The device flange 1184 abuts the encapsulation material 1152 but does not touch the DUT 1126 according to an embodiment. Consequently, the DUT 1126 backside surface 1128 may be exposed entirely to temperature-control fluids without risk of fouling or physical damage to the DUT 1126, but peripheral structures are protected from contact with the thermal-control fluid.

In an embodiment, the aspect ratio of the height of the collapsible wall 1182 to the width (height-to-width) of either of the flanges 1180 and 1184 is 1:1. In an embodiment, the aspect ratio is in a range from 1.1:1 to 2:1. As the aspect ratio increases, more downward motion of the direct fluid-contact thermal block may be allowed to achieve a more useful spacing between the backside 1128 of the DUT 1126 and the base plane of the direct fluid-contact thermal block. Significant enough pressure may be placed on the encapsulation material 1152 that surrounds the DUT 1126 in order to simultaneously achieve more secure sealing and a more useful spacing during testing.

Figure 12:
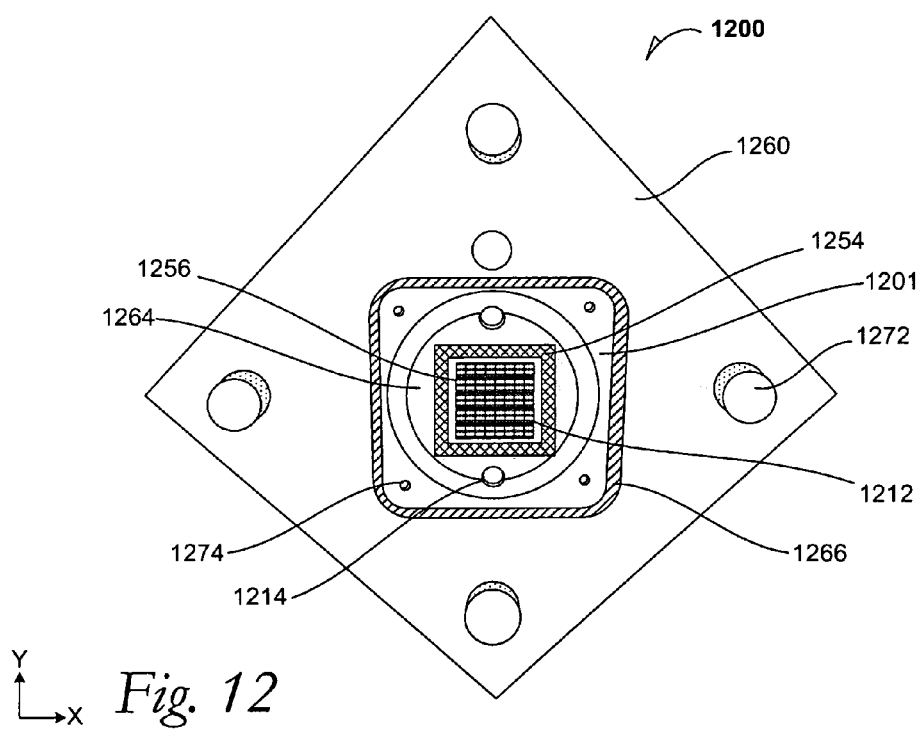
FIG. 12 is a bottom perspective plan of a chip-testing system 1200 according to an example embodiment.

FIG. 12 is a bottom perspective plan of a chip-testing system 1200 according to an example embodiment. A direct fluid-contact thermal block 1201 is seen along with a microchannel array 1212 for making direct contact to a DUT. A plurality of head bolt orifices are provided, one of which is indicated with reference numeral 1214.

An inner cavity 1256 area and a pressurized outer cavity 1264 area are separated by an inner seal 1254 and also surrounded by a sealing-block O-ring 1266. The inner cavity 1256 can be de-pressurized to prevent unwanted cooling fluid from exiting.

Pressure control may be achieved through a plurality of pressure ports, one of which is indicated with reference numeral 1274. The direct fluid-contact thermal block 1201 is held in place with a package sealing block and a thermal fluid porting block 1260. Spring-loaded shoulder bolts 1272 guide the thermal fluid porting block 1260 onto the direct fluid-contact thermal block 1201.

Figure 13:
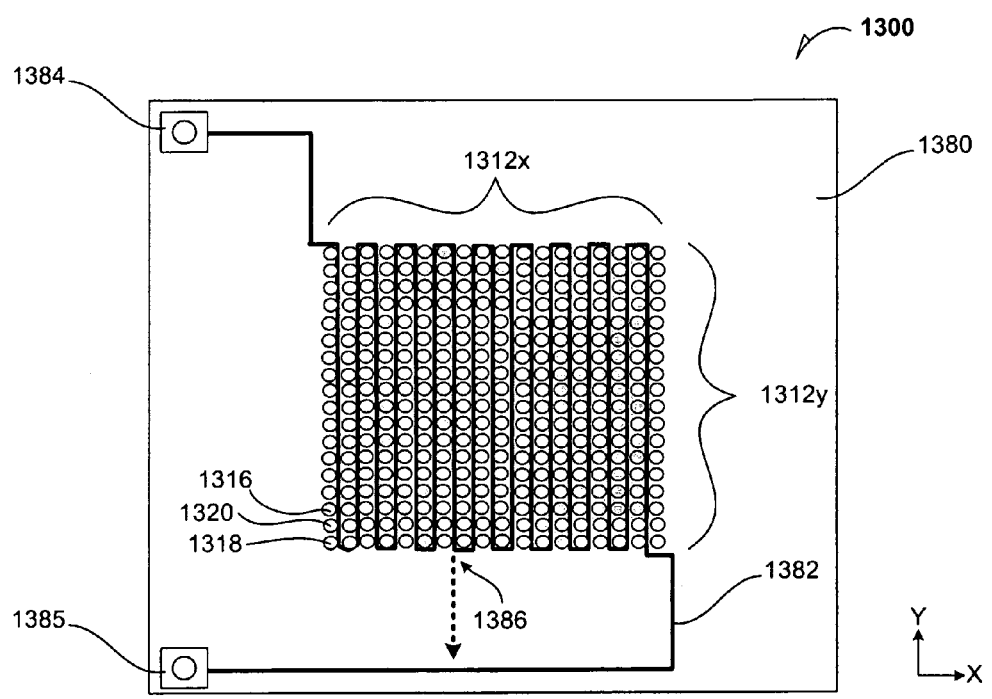
FIG. 13 is a top plan of a resistive heater that is embedded in a laminate layer for a fluid-contact thermal block according to an example embodiment.

FIG. 13 is a top plan of a resistive heater that is embedded in a laminate layer 1300 for a fluid-contact thermal block according to an example embodiment. A laminate type 1380 is depicted with a fluid-flow array 1312 that may be near a die interface surface. It will now be understood, however, that a resistive heater may be placed interstitial to fluid-flow orifices at several laminate types.

A resistive heater 1382 is laid out between electrical terminals 1384 and 1385 and that undulates through the fluid-flow array 1312 in order to make conductive heat transfer to fluid that is passing through the microchannels. In an embodiment, the ceramic insert replaces at least one laminate type layer such as the illustrated laminate types depicted in FIGS. 6a though 6f. Consequently, the resistive heater will undulate between the structures such as collectors, plenums, and distributors etc. depending upon the laminate type.

The resistive heater 1382 passes in the close proximity to a unit cell that includes a fluid-supply first orifice 1316 and a fluid-supply subsequent orifice 1318, along with a single fluid-return orifice 1320.

In an embodiment, the resistive heater 1382 is configured to cover a fraction of the fluid-flow array 1312. For example, half of the fluid-flow array 1312 may be covered with the resistive heater 1382 by exiting the array 1312 at the point 1386 such that half of the array 1312x is covered by the resistive heater 1382, and all of the array 1312y is covered. In this configuration the resistive heater 1382 exits array 1312 and connects to the terminal 1385 from the point 1386. Consequently, a fraction of the array 1312 may apply resistive heat to the DUT while the balance of the array 1312 may be cooling or passive during testing. Such fractional array layout is useful to temperature control only a portion of a DUT.

Figure 14:
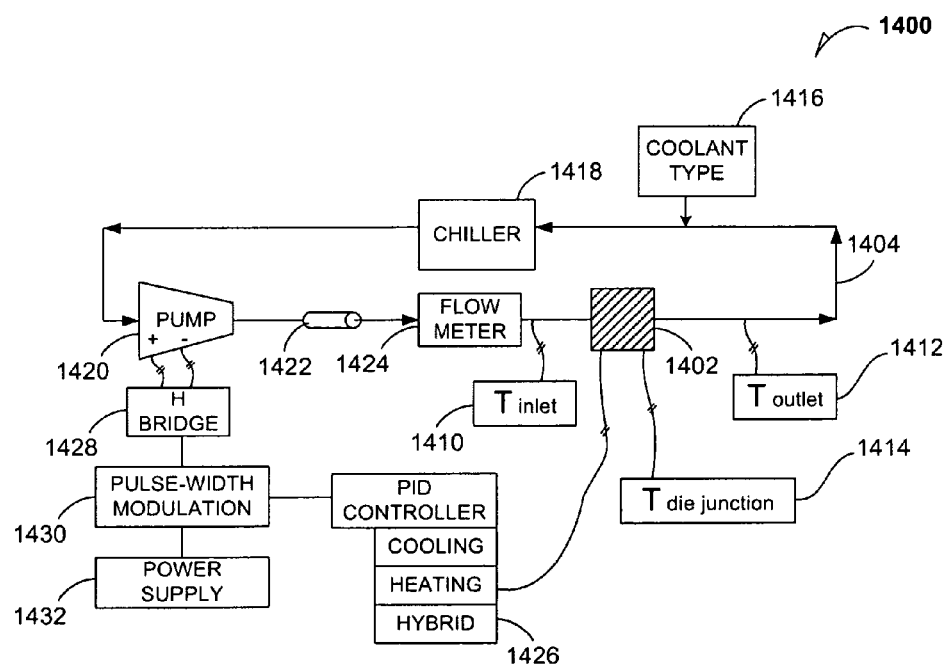
FIG. 14 is a control method diagram according to several embodiments.

FIG. 14 is a control method diagram 1400 according to several embodiments. A DUT 1402 is temperature controlled in part by circulating a cooling fluid 1404 in a feedback loop.

Temperature control of the DUT includes monitoring the inlet temperature 1410 of the temperature-control fluid as well as the outlet temperature 1412. The temperature of the DUT 1402 is also monitored at the die junction temperature 1414.

In an embodiment, coolant type 1416 is water. In an embodiment, coolant type 1416 is propendiol. Other coolants may be used depending upon a given testing requirement.

A chiller 1418 is placed within the feedback loop and fluid flow is driven by a pump 1420. In an embodiment, pump control is carried out with an H-bridge 1428. The control method incorporates the pump 1420 in which the speed of the pump is controlled by a pulse-width-modulation control 1430 connected to the H-bridge 1428. By controlling the speed of the pump 1420, the thermal resistance of the direct fluid-contact thermal block is varied and consequently the die temperature may be controlled.

The flow regime is controllable with a flow filter 1422 and monitorable with a flow meter 1424. Flow-regime control is assisted with the H-bridge 1428, which provides the capability to both reverse the pump motor direction and apply motor braking/deceleration to quickly change the flow rate through the cold plate and thus the die temperature. Pulse width modulating the input to the pump motor allows for precise control of the pump speed for flow rate control. As the die heat flux increases and consequently the die temperature, the pump speed increases to provide additional cooling. Likewise, as the die heat flux decreases, the pump speed decreases to maintain a constant die temperature.

Another control method integrates the laminate type (e.g. laminate type 1380, such as a ceramic plate, with the internal resistive heating traces 1382) into the base of the direct fluid-contact thermal block, which enables modulation and dynamic control of the die.

In an embodiment, the resistive heating traces 1382 are replaced by an inline direct liquid cooling micro channel that is combined with either a resistive thin film heater or thermoelectric cooler to actively control the inlet fluid temperature set point to the direct liquid cooling micro channel. Controlling the inlet fluid temperature set point provides the capability to target the nominal temperature of the die.

Returning to FIG. 14, a power supply 1432 is provided to drive the pump 1420 and other devices. The power supply 1432 is also connected to a controller that may be a proportional-integral-derivative (PID) controller 1426 that can respond to test conditions. Other control methods may include servo (user-directed) control. In an embodiment, proportional control is used. In an embodiment, integral control is used. In an embodiment, derivative control is used. In an embodiment, a combination of control methods is used. The controller 1426 may also operate in heating mode with the use of internal resistive heating traces such as set forth in this disclosure.

Although a device under test may refer to a processor chip, a processor chip or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An apparatus to temperature-control a semiconductive device, comprising:
   a structure including a planar surface defining a plurality of heat-transfer fluid unit cells, the heat-transfer fluid unit cells each including:
   a fluid supply structure including at least one supply-orifice and a supply-orifice total cross-sectional area, wherein the supply-orifice total cross-sectional area consists of the total area of the at least one supply-orifice along the planar surface, and
   a fluid return structure including at least one return-orifice and a return-orifice total cross-sectional area, wherein the return-orifice total cross-sectional area consists of the total area of the at least one return-orifice along the planar surface;
   wherein the supply-orifice total cross-sectional area is greater than the return-orifice total cross-sectional area.

2. The apparatus of claim 1, wherein the at least one supply-orifice comprises a plurality of supply-orifices.

3. The apparatus of claim 1, wherein the at least one supply-orifice comprises a first supply-orifice and a second supply-orifice, the first supply-orifice and the second supply-orifice each positioned to direct a flow of a fluid into direct communication with a semiconductive device, wherein the at least one return-orifice comprises a single return-orifice, and wherein the single return-orifice is positioned between the first supply-orifice and the second supply-orifice.

4. The apparatus of claim 1, the structure further comprising a liquid impermeable seal positioned to surround a periphery of the plurality of heat-transfer fluid unit cells, wherein the liquid impermeable seal comprises a block flange, a collapsible wall, and a device flange, and wherein an aspect ratio of the height of the collapsible wall to the width of either of the block flange and the device flange is between 1.1:1 and 2:1.

5. The apparatus of claim 1, wherein the structure including at least one heat-transfer fluid unit cell is part of a direct fluid-contact thermal block, wherein the direct fluid-contact thermal block comprises a plurality of laminate types coupled together.

6. The apparatus of claim 1, wherein each of the heat-transfer unit cells makes up one-third of a unit block in an array of supply-orifices and return-orifices disposed in the planar surface of the structure.

7. A chip-testing system comprising:
   a device under test (DUT) footprint on a direct fluid-contact thermal block including at least one supply-orifice and at least one return-orifice, wherein the at least one supply-orifice and the at least one return-orifice are positioned within the DUT footprint;
   an inner seal affixed to the direct fluid-contact thermal block, wherein the inner seal is configured to surround a DUT and form a pressurized inner cavity, wherein the inner seal is configured to surround the DUT without coming into direct contact with the DUT;
   a gasket affixed to a package sealing block that houses the direct fluid-contact thermal block, wherein the gasket enables a pressurized outer cavity that encompasses the pressurized inner cavity; and
   a thermal fluid porting block that can cause the direct fluid-contact thermal block to control a position of the DUT by suction.

8. The chip-testing system of claim 7, wherein the direct fluid-contact thermal block including at least one supply-orifice and at least one return-orifice comprises:
   a planar surface including at least one heat-transfer fluid unit cell, the at least one heat-transfer fluid unit cell including:
      at least one supply-orifice and a supply-orifice total cross-sectional area consisting of the total area of the at least one supply-orifice along the planar surface; and
      at least one return-orifice and a return-orifice total cross-sectional area consisting of the total area of the at least one return-orifice along the planar surface;
      wherein the supply-orifice total cross-sectional area is greater than the return-orifice total cross-sectional area.

9. The chip-testing system of claim 7, wherein the DUT comprises a semiconductive device, wherein the DUT is disposed on a mounting substrate and affixed to the mounting substrate with an encapsulation material, and wherein the inner seal is configured to mate with the encapsulation material.

10. The chip-testing system of claim 7, further including a resistive heater disposed in the direct fluid-contact thermal block.

11. The chip-testing system of claim 7, further including a controller wherein the controller includes pulse-width modulated H-bridge pump control.

12. The chip-testing system of claim 7, further including a controller wherein the controller includes proportional, integral, and derivative control and combinations thereof.

13. The chip-testing system of claim 7, further including a controller wherein the controller includes servo control.

14. The chip-testing system of claim 7, further including a coolant fluid that is a two-phase refrigerant.

15. The chip-testing system of claim 8, wherein the at least one heat-transfer fluid unit cell includes a first supply-orifice, a second supply-orifice, and a single return-orifice, wherein the single return-orifice is positioned between the first supply-orifice and the second supply-orifice.

16. An apparatus to temperature-control a semiconductive device, comprising:
   a structure including a planar surface defining at least one heat-transfer fluid unit cell, the at least one heat-transfer fluid unit cell including:
      a fluid supply structure including a first supply-orifice and a second supply-orifice positioned to direct a flow of a fluid into direct communication with a semiconductive device, wherein the first supply-orifice and the second supply-orifice define a supply-orifice total cross-sectional area consisting of the area of the first supply-orifice and the area of the second supply-orifice along the planar surface, and
      a fluid return structure including a single return-orifice positioned between the first supply-orifice and the second supply-orifice, wherein the single return-orifice defines a return-orifice total cross-sectional area consisting of the area of the single return-orifice along the planar surface;
      wherein the supply-orifice total cross-sectional area is greater than the return-orifice total cross-sectional area.

17. The apparatus of claim 16, further comprising a mounting substrate adapted to receive a semiconductive device thereon; and wherein the structure further includes an liquid impermeable inner seal configured to surround a periphery of the at least one heat-transfer fluid unit cell and configured to mate with the mounting substrate.

18. The apparatus of claim 17, further comprising a semiconductive device coupled to the mounting substrate through an encapsulation material, wherein the liquid impermeable inner seal is configured to mate with the mounting substrate through the encapsulation material.

19. The apparatus of claim 18, wherein the liquid impermeable inner seal is positioned to extend around a periphery of the semiconductive device without directly contacting the semiconductive device.

20. The apparatus of claim 16, wherein the first supply-orifice defines a first cross-sectional area along the planar surface, the second supply-orifice defines a second cross-sectional area along the planar surface, and the single return-orifice defines a third cross-sectional area along the planar surface, wherein the first cross-sectional area, the second cross-sectional area, and the third cross-sectional area are equal to one another.

* * * * *